United States Patent [19]

Barden et al.

[11] Patent Number: 4,889,492

[45] Date of Patent: Dec. 26, 1989

[54] HIGH CAPACITANCE TRENCH CAPACITOR AND WELL EXTENSION PROCESS

[75] Inventors: John M. Barden, Albuquerque, N. Mex.; Howard K. H. Leung, Austin, Tex.

[73] Assignee: Motorola, Inc., Schaumburg, Ill.

[21] Appl. No.: 860,738

[22] Filed: May 7, 1986

[51] Int. Cl.$^4$ .............................................. H01G 7/00
[52] U.S. Cl. ....................................... 437/15; 437/47; 437/164; 437/165
[58] Field of Search ..................... 437/38, 47, 52, 78, 437/164, 165, 67, 61, 15; 357/23.6; 29/25.42

[56] References Cited

U.S. PATENT DOCUMENTS

| | | | |
|---|---|---|---|
| 4,263,067 | 4/1981 | Takahashi et al. | 437/164 X |
| 4,569,701 | 2/1986 | Oh | 148/188 |
| 4,698,104 | 10/1987 | Barker et al. | 437/141 |

FOREIGN PATENT DOCUMENTS

| | | |
|---|---|---|
| 60-64444 | 4/1985 | Japan . |
| 60-140860 | 7/1985 | Japan . |
| 0152059 | 8/1985 | Japan .............................. 357/23.6 |

OTHER PUBLICATIONS

K. Terada et al., "A New VLSI Memory Cell Using Capacitance Coupling (CC Cell)", IEEE Transactions on Electron Devices, vol. ED-31, No. 9, Sep. 1984, pp. 1319-1324.

K. Minegishi et al. "A Submicron CMOS Megabit Level Dynamic RAM Technology Using Doped Face Capacitor Cell", 1983 Tech. Digest IEEE IEDM, Dec. 1983, pp. 319-321.

Yamada et al., IEDM (1985), pp. 702-705.

Primary Examiner—Olik Chaudhuri
Attorney, Agent, or Firm—John A. Fisher

[57] ABSTRACT

A process for fabricating high-capacitance trench capacitors in a lightly doped, shallow well of a semiconductor substrate. The process involves a two-step doped glass deposition/diffusion routine. After trench formation into a shallow, lightly doped well, a first doped glass is deposited inside the trench and the dopant is diffused from the glass through the trench interior surface to form a region or halo of extra doping around and below each trench. A second doped glass deposition and diffusion of an impurity of the opposite conductivity type to a shallow depth on the trench wall surfaces provides a p/n junction with the first diffusion region to increase the capacitance of the subsequent capacitor. In addition, the trench devices are better isolated from each other, the substrate and any adjacent devices.

17 Claims, 3 Drawing Sheets

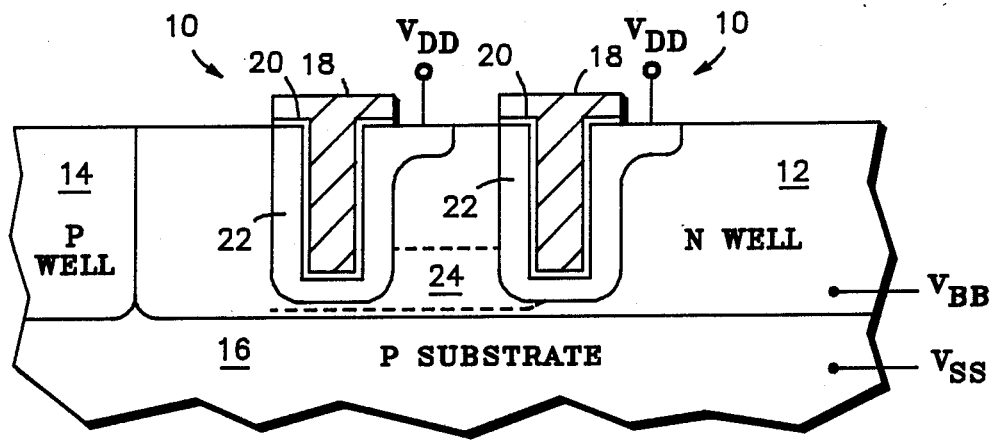
FIG. 1 —PRIOR ART—
FIG. 2A —PRIOR ART—
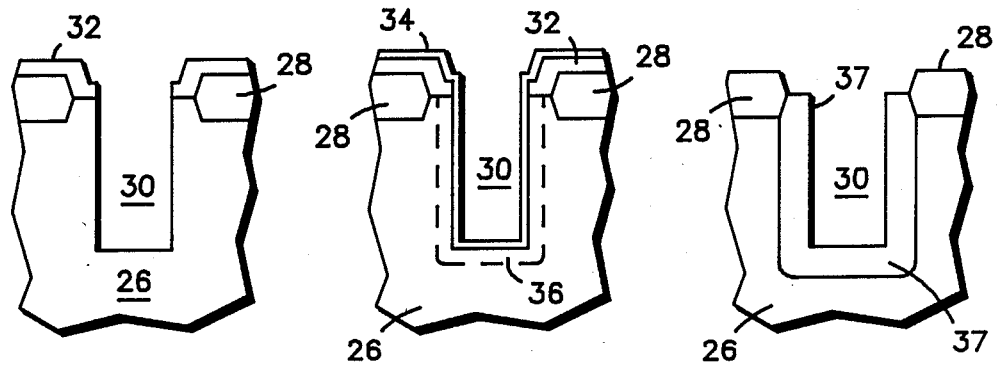
FIG. 2B    FIG. 2C
FIG. 3
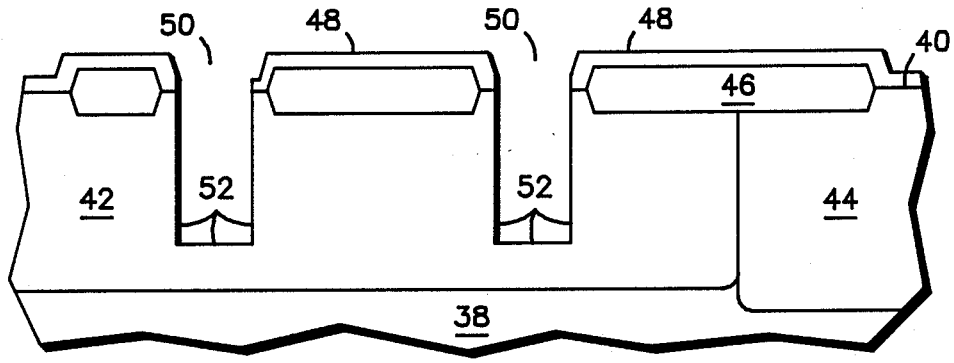

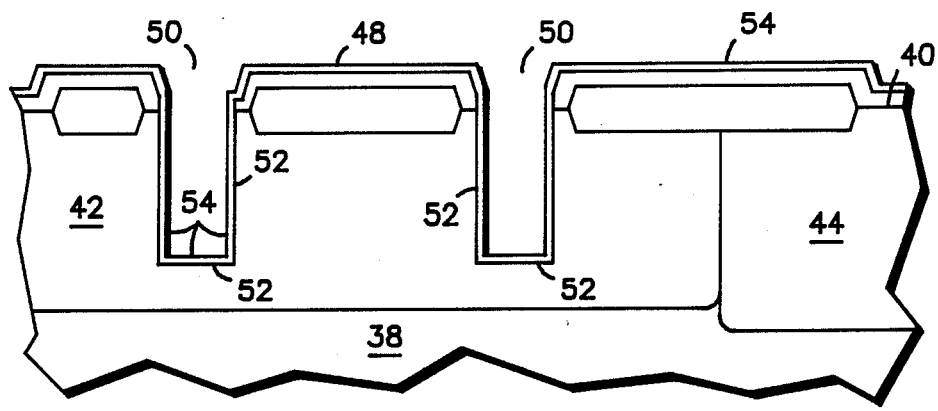
FIG. 4
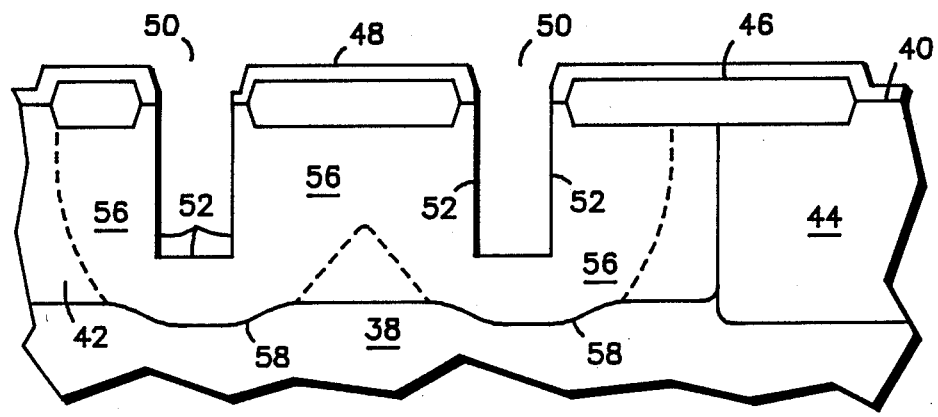
FIG. 5
FIG. 6
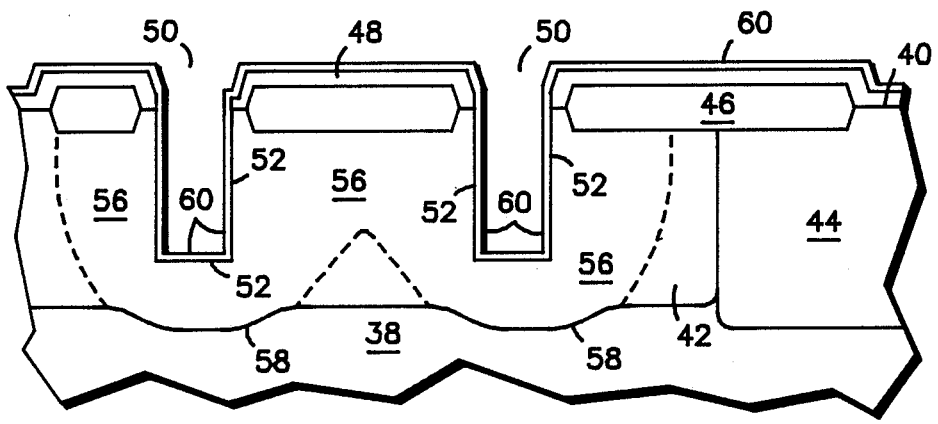

HIGH CAPACITANCE TRENCH CAPACITOR AND WELL EXTENSION PROCESS

CROSS-REFERENCE TO A RELATED APPLICATION

This application is related to U.S. Ser. No. 860,734, filed May 7, 1988, which is concerned with well extensions for trench devices.

FIELD OF THE INVENTION

The invention relates to capacitors fabricated as part of semiconductor integrated circuits, and more particularly relates to trench capacitors for semiconductor integrated circuits having high unit capacitance.

BACKGROUND OF THE INVENTION

To increase storage capacity in semiconductor integrated circuit dynamic random access memories (DRAMs), trench capacitors are being widely explored. Nearly all published reports have employed trenches formed in bulk or in regions doped of a given type consistent throughout the wafer. For example, see K. Minegishi, et al. "A Submicron CMOS Megabit Level Dynamic RAM Technology Using Doped Face Trench Capacitor Cell,"*Tech. Digest, IEEE IEDM*, July, 1983, pp. 319-322 and J. Yamada, et al. "A Submicron 1 Mbit Dynamic RAM with a 4-Bit-at-a-Time Built-In ECC Circuit," *IEEE Journal of Solid-State Circuits*, Vol. SC-19, No. 5, October, 1984, pp.627-633.

Placing a trench in a well in the opposite type of substrate produces better soft error protection and lower junction leakage (the diffusion component) in the subsequently made devices because the number of minority carriers that are available to discharge the dynamic nodes are only those available within the well dimension which is small compared to the minority carrier diffusion lengths, which are relatively large.

A major problem in placing a trench in a well of the opposite type of conductivity is the fact that only a small amount of charge (due to well doping under the trench) is available to electrically isolate the trench inversion layer or capacitor electrode layer from the substrate.

As an example, consider a p-channel metaloxidesemiconductor (PMOS) trench capacitor in an n-type well in a p-type substrate as illustrated in FIG. 1. Of course, similar arguments apply for an NMOS trench capacitor in a p-type well in an n-type substrate. In FIG. 1, semiconductor trench capacitors 10 are formed in n-type well 12 adjacent to p-type well 14 in p-type substrate 16. Throughout this application it should be realized that the prior art structures and the structures of the instant invention also work equally well in trenches in p-wells and in trenches in wells of the same conductivity type as the substrate. Capacitors 10 have plates 18 which may be polysilicon and are formed over capacitor dielectric layers 20 and p+ regions 22. Depletion region 24 forms the lateral punchthrough path between the p+ regions 18 of the two capacitors 10 shown.

Envision the p+ regions 22 of capacitors 10 cell potentials at $V_{DD}$ (e.g. 5V), the n well 12 at $V_{BB}$ (e.g. +7.5 V) and the p substrate 16 at $V_{SS}$ (e.g. 0V). Both the cell to well and well to substrate junctions are reverse biased. The cells 10 can punchthrough to the substrate 16 if insufficient doping exists in the well 12 below the trenches 10, that is between the p+ cell doping regions 22 to the p substrate 16. Also, resistance below and between trench capacitors such as 10 can be very high, thus degrading performance of the circuit.

In addition, for trench capacitors that are placed close to each other, lateral punchthrough currents can exist in depletion region 24 between or below the trench capacitors 10 where the well doping is light, i.e. where cell to cell depletion regions can touch.

Typically, the trench capacitors 10 of FIG. 1 may be formed by the steps illustrated in FIG. 2. A semiconductor substrate 26 is provided with isolation regions 28 between which a trench 30 is formed, as by reactive ion etching (RIE) for example, via mask pattern 32 shown in FIG. 2A. FIG. 2B illustrates a doped glass layer 34 which is deposited over the exposed surface of the substrate 26 even over the interior surfaces of trench 30. The substrate 26 is then put through a thermal cycle which partially diffuses the dopant into partial region 36. After the doped glass layer 34 is removed as seen in FIG. 2C, the dopant is further thermally diffused to form final dopant region 37. For more information, see the Minegishi, et al. and the Yamada, et al. articles cited above.

To avoid the problems caused by forming trench devices in shallow, lightly doped wells, two approaches are available. First, a heavily doped n well can be utilized to provide sufficient doping below and between trench capacitors. This approach is not advantageous because the performance of the PMOS devices in the heavily doped n well will be compromised.

Alternatively, if a moderately doped well were desired to prevent deleterious effects on PMOS performance, a very deep well is needed to produce sufficient charge below the trench capacitor and between adjacent capacitors. Such a deep well would require long thermal cycles to drive in the well impurity deeply below the trench.

However, for reasonable net charges below the cell electrode (excluding depletion regions) of about $2 \times 10^{12}$ ions/cm$^2$ and reasonable trench depths of 3 microns, for example, a moderately doped well (not lightly doped) would have to be about 8 microns deep, which is unusually deep. Some of the major disadvantages of such deep wells include large lateral diffusion, hence large separations would be required between PMOS and NMOS transistors thus eliminating the compactness advantage of the trench technology, and also a thick epitaxial layer would be required to keep the heavily doped substrate from diffusing up into the epitaxial layer. Also, a large transition distance between the lightly doped epitaxial layer and the substrate boundary would be required to prevent degradation of latchup protection due to large vertical up diffusion from the substrate.

These disadvantages conflict with providing latchup immunity with epitaxy, which requires thin epitaxial layers and short transition distances, as well as soft error protection since the deeper well produces a larger volume for minority carrier generation to discharge dynamic nodes. In addition, larger volumes produce more minority carrier diffusion current, which is also deleterious to charge storage in dynamic nodes.

High capacitance planar capacitors formed by double-diffusing n and p+ layers are described by K. Terada, et al., in "A New VLSI Memory Cell Using Capacitance Coupling (CC Cell)," *IEEE Transactions on Electron Devices*, Vol. ED-31, No. 9, September, 1984, pp. 1319-1324.

SUMMARY OF THE INVENTION

Accordingly, it is an object of the present invention to provide an integrated circuit having trench devices in a well in a substrate of opposite conductivity to have better soft error protection and lower junction leakage.

Another object of the present invention is to provide integrated circuit trench devices in a well of opposite conductivity from the substrate having the above advantages without requiring a heavily doped well or an extraordinarily deep well.

It is another object of the present invention to provide integrated circuit trench devices having the above noted properties by a method which does not require an extra mask step, or which may even eliminate a mask level.

Still another object of the present invention is to provide integrated circuit trench capacitors with increased capacitance by substantially increasing the p/n junction capacitance of the cell.

Yet another object of the invention is to provide an integrated circuit memory having better isolation between the cells, between the cell itself and the transfer gate, between the cell and p+ source/drain and between the cell and the substrate.

It is still another object of the present invention to provide trench capacitors having decreased capacitor charge loss.

In carrying out these and other objects of the invention, there is provided, in one form, a semiconductor substrate suitable for high capacitance trench capacitors having a doped well of a first conductivity type formed into a face of the semiconductor substrate. A plurality of trenches are formed within the well, where the trenches extend down into the well from the substrate face, each trench being defined by a plurality of interior surfaces defining an interior space. In each trench, there is a region of extra doping of the first conductivity type extending from each of the trenches outward into the well and a doped trench face extending over the interior surfaces of each trench, the trench face being doped with an impurity of a second conductivity type.

BRIEF DESCRIPTION OF THE DRAWINGS

FIG. 1 is a cross-section view of a pair of prior art trench capacitors illustrating punchthrough problems;

FIG. 2 is a cross-section view of a trench capacitor, such as those of FIG. 1, under construction according to a prior art method;

FIG. 3 is a cross-section view of a pair of trench capacitors under construction according to the method of the present invention after the trenches have been etched;

FIG. 4 is a cross-section view of the trench capacitors under construction of FIG. 3 after they have been coated with a thin layer of PSG;

FIG. 5 is a cross-section view of the trench capacitors of FIG. 4 after the phosphorus dopant from the PSG has been diffused;

FIG. 6 is a cross-section view of the trench capacitors under construction in FIG. 5 after they have been coated with a thin layer of BSG;

Figure 7:
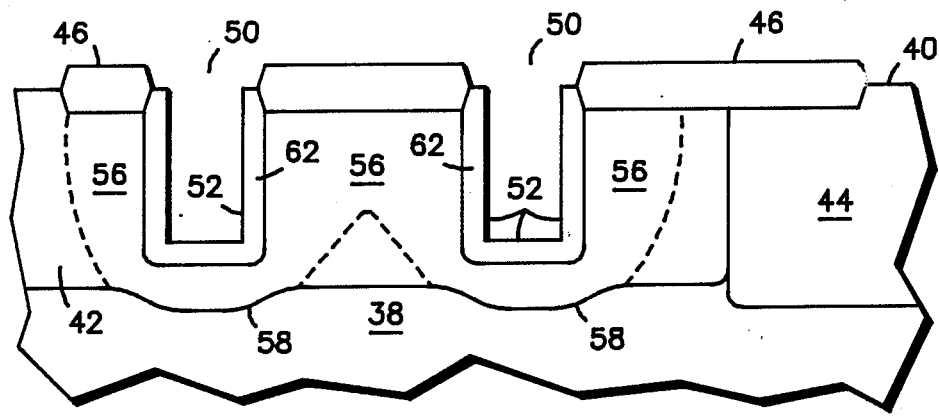
FIG. 7 is a cross-section view of the trench capacitors under construction in FIG. 6 after an anneal step and the BSG is stripped.

It should be noted that the vertical dimensions of the structures illustrated herein are greatly exaggerated for the purpose of clarity.

DETAILED DESCRIPTION OF THE INVENTION

Shown in FIG. 3 is a substrate 38 having a major surface 40 which bears a shallow n-well 42 and an adjacent shallow p-well 44 having field isolation regions 46 formed on the surface 40 and patterned by means of mask patterning layer 48, which may be photoresist or a combination of photoresist and another layer of masking material. A plurality of trenches 50 have been etched into substrate 38 through the openings in mask patterning layer 48 by anisotropic means, such as reactive ion etching (RIE). Trenches 50 have a plurality of interior surfaces 52 that enclose the interior space of the trench 50. It may be seen from FIG. 1 that the distance between the bottom of trenches 50 and the bottom of shallow n-well 42 is not very great and a problem arises in that not enough charge is present to properly isolate the device to be formed and permit the device to operate properly.

Shown in FIG. 4 is the structure of FIG. 3 that has had a first dopant carrying material 54 applied to the entire exposed surface including the interior surfaces 52 of the trenches 50. The dopant carrying material may be any suitable solid, liquid or even gaseous substance capable of transferring dopant through the trench interior surfaces 52 into the well 42 a predetermined distance. For the purposes of continued discussion of one particular embodiment of the invention, dopant carrying material 54 will be taken to be a solid doped glass material.

The doped glass layer 54 must be of a type that will diffuse the dopant contained therein into an adjacent silicon surface such as interior surfaces 52 of the trenches 50. Such glasses are well known in the art. An additional characteristic of the glass layer 54 is that the dopant contained therein must be of the same conductivity type as that present in the shallow n-well 42. Of course, it is expected that the invention described herein would be equally applicable to trenches formed within shallow p-well 44, in which case a p-type dopant should be present in first doped glass layer 54. The invention described herein could be just as easily disclosed in terms of capacitors formed in a p-well.

For the present description, the dopant may be any of the known n-type dopants, namely phosphorus or arsenic. In one embodiment of the invention, the first dopant glass layer 54 is phosphosilicate glass or PSG.

While first doped glass layer 54 is in place, the substrate is put through a diffusion cycle, typically a thermal step wherein the dopant in the glass layer diffuses through the interior surfaces 52 to form a region of extra doping 56 of the n-type extending from each of the trenches 50 outward into the n-well 42, as seen in FIG. 5. This region of extra doping 56 can be further extended by additional annealing after the PSG layer 54 has been removed. This extra doping region 56 provides better isolation between the trench capacitors and other adjacent devices such as gates or transistors and between the trench capacitors and the substrate. In fact, the actual profile of the n-well 42 may be altered somewhat by bulges or extensions 58 below the trenches indicating the potential additional charge available for isolating the trench devices. Additionally, the method of this invention could be used in the case where the bottom of trenches 50 extended below the bottom boundary of the shallow n-well 42. The extra doping region 56 would provide individual, isolated pockets of n-type doping around each trench. FIG. 5 simply shows the structure that would result after the removal of the first dopant glass layer 54.

Shown in FIG. 6 is the structure of FIG. 5 in which a second layer of doped glass 60 is deposited over the entire exposed surface of the substrate including the interior surfaces 52 of all of the trenches 50. The dopant of the second layer of doped glass 60 must be of a different type of conductivity from that of the first dopant glass layer 54. Since in this description, the dopant for the first dopant glass layer 54 was n-type to match the n-well 42, the dopant of the second glass layer 60 must be p-type or selected from Group IIIA of the Periodic Table, such as boron. In a particular embodiment, second doped glass layer 60 may be borosilicate glass, or BSG.

Again, a diffusion thermal cycle is performed to diffuse the impurity through the interior surfaces 52 of trench 50, although in this case, the diffusion front should not be driven as far into the n-well as the region of extra doping 56, to form doped trench faces 62 within the interior surfaces 52 as seen in FIG. 7. The two diffusion steps increase the p/n junction capacitance of the capacitor cell to form a high capacitance (High-C) trench cell which permits the trench depth to be reduced and thus leaves more critical dimension budget for sidewall taper of the trench, i.e. one can afford to allow more lateral space for the trench taper. Both of these characteristics would decrease cell-to-cell leakage.

It may occur to one skilled in the art that if both PSG and BSG were used in one process, that time and effort might be saved if borophosphosilicate glass (BPSG) were used and both dopants would be diffused from the glass simultaneously. An experiment was conducted to see if this approach would work and it was discovered that the boron travels much faster than the phosphorus present under the experimental conditions and that in fact the phosphorus had travelled little or no distance at the time the correct boron boundary was defined. These relative rates of boron and phosphorus are thus the opposite of what they desirably would be. However, in the opposite case, that is, double-doping the sides of a trench in a p-well, the use of BPSG to provide both doping regions simultaneously may be optimized.

Figure 8:
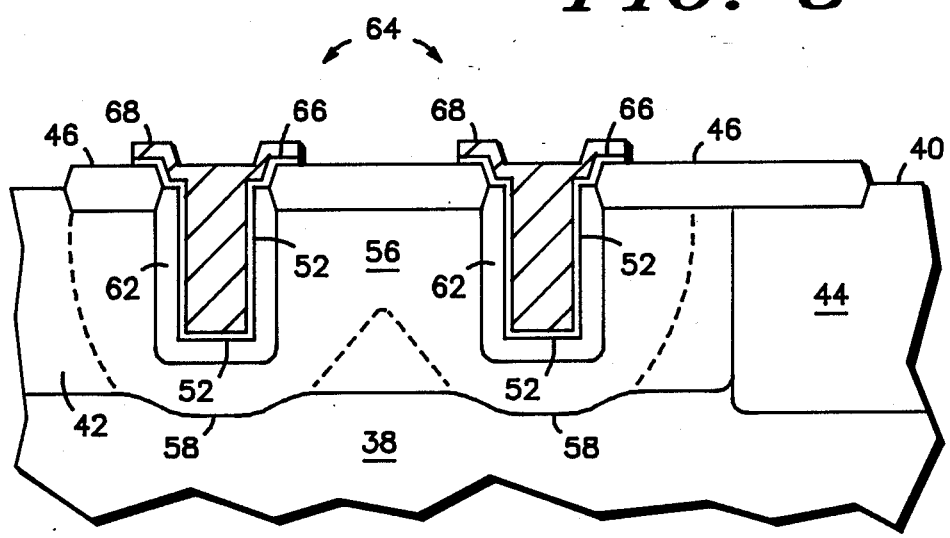
FIG. 8 is a cross-section view of the finished trench capacitors of the present invention.

Again, the second doped glass layer 60 is removed to give the trench structure seen in FIG. 7. This structure could be the precursor to the formation of any type of trench device which require the extra doping noted. Finished trench capacitors 64 shown in FIG. 8 also have a thin dielectric layer 66 formed over interior surfaces 52, and conductive plugs 68, which may be doped polysilicon or the like, filling the remaining interior space of the trenches 50.

The two-step procedure for doping trench sidewalls or interior surfaces 52 has the advantages of (1) better isolation between cells, between cells and other devices, such as transfer gates, and between cells and source/-drain regions, and between the cells 64 and the substrate 38, thus decreasing capacitor charge loss; (2) omission of an n-well 42 field implant in the array, which results in higher p+ to n-well junction breakdown voltage and lower bit line capacitance; (3) increasing the p/n junction capacitance of the cell capacitor which allows the trench depth to be reduced and sidewall taper to be increased (both of these would decrease cell-to-cell leakage); and (4) decreased n-well 42 depth to attain the same capacitance as deep trench capacitors made by other means. Additionally, the omission of one mask layer, the cell implant, could be accomplished with the right set of design rules.

Disadvantages would include added process complexity and the necessity of good process control on the boron and phosphorus concentrations in the doped glasses.

In a typical example, not intended to limit the scope of the invention, the phosphorus from first glass layer 54 would be diffused to a depth of about 0.8 microns (um) as compared with the depth of boron of about 0.3 um from the interior surfaces of the trenches.

The feasibility of this method has been demonstrated on planar silicon wafers. The wafers were 14–22 ohm-cm p-type and were processed with an n-well (phosphorus) implant and diffusion. A first doped glass layer of BPSG of 4.5% boron and 2.1% phosphorus of 2900 Angstrom thickness was used to form the "interior surface" 52 layer of opposite conductivity type from the well. The BPSG was annealed in nitrogen for 16 minutes at 900° C. and then etched off. Polysilicon capacitors were formed and tested and found to have greatly increased capacitance. An analysis of the devices showed that the phosphorus n-well was 5.24 um deep and the boron diffusion was 1.44 um deep into the substrate surface. Subsequent experiments on planar wafers suggest an optimal boron concentration might be about $1 \times 10^{19}$ atoms/cm$^3$, and that much shallower boron diffusions are attainable.

We claim:

1. A process for making trench devices in a semiconductor substrate comprising:

forming a well of a first conductivity type in a face of the semiconductor substrate, the well having a bottom;

forming a plurality of trenches within the well, the trenches extending down into the well from the substrate face, each trench having a plurality of interior surfaces, one of which is a bottom surface shallower than the bottom of the well, defining an interior space;

forming a region of extra doping of the first conductivity type extending from each of the trenches outward into the well; and forming a doped trench face extending over the interior surfaces of each trench, the trench face being doped with an impurity of a second conductivity type; and forming a thin dielectric layer over the interior surfaces of the trench.

2. A process for high capacitance trench capacitors in a semiconductor substrate comprising:

forming in a face of the semiconductor substrate at least one well of a first conductivity type, the well having a bottom;

forming a plurality of trenches within the well, the trenches extending down into the well from the substrate face, each trench having a plurality of interior surfaces, including a bottom surface shallower than the bottom of the well, defining an interior space;

performing the following two doping formation steps in any order:

forming a region of extra doping of the first conductivity type extending from each of the trenches outward into the well; and forming a doped trench face extending over the interior surfaces of each trench, the trench face being doped with an impurity of a second conductivity type; and forming a thin dielectric layer over the trench interior surfaces that contain dopant of the second conductivity type; and filling the interior space of each trench remaining after thin dielectric layer formation, with a plug of conductive semiconductor material.

3. The process of claim 2 in which the first conductivity type is n-type and the impurity of the first conductivity type is provided by phosphorus.

4. The process of claim 2 in which the second conductivity type is p-type and the impurity of the second conductivity type is boron.

5. The process of claim 2 wherein the formation of the region of extra doping of the first conductivity type is conducted by the process comprising:

inserting into the trenches a first dopant carrying material having a quantity of dopant of the first conductivity type;

distributing the dopant from the dopant carrying material into the trench interior surfaces to form a region of extra doping of the first conductivity type extending from each of the trenches outward into the well; and removing the first dopant carrying material from the trenches.

6. The process of claim 5 wherein the dopant in the first dopant carrying material is phosphorus.

7. The process of claim 5 wherein the dopant carrying material is a phosphosilicate glass.

8. The process of claim 5 wherein the dopant carrying material is a gas.

9. The process of claim 5 wherein the dopant is diffused further in an additional annealing step after the dopant carrying material is removed.

10. The process of claim 2 wherein the formation of the doped trench face extending over the interior surfaces of each trench is conducted by the process comprising:

inserting into the trenches a second dopant carrying material having a quantity of dopant of the second conductivity type;

distributing the dopant from the second dopant carrying material into the trench interior surfaces to form a doped trench face of the second conductivity type extending from each of the trenches outward into the well a distance not as great as the region of extra doping of the first conductivity type extending from each of the trenches outward into the well; and removing the second dopant carrying material from the trenches.

11. The process of claim 10 in which the dopant of the second conductivity type is boron.

12. The process of claim 10 in which the second dopant carrying material is borosilicate glass.

13. The process of claim 10 in which the second dopant carrying material is a gas.

14. A process for high capacitance trench capacitors in a semiconductor substrate comprising:

forming in a face of the semiconductor substrate at least one well of n-conductivity type, the well having a bottom;

forming a plurality of trenches within the well, the trenches extending down into the well from the substrate face, each trench having a plurality of interior surfaces, one of which is a bottom surface shallower than the bottom of the well, defining an interior space;

depositing on the interior surfaces of the trenches a layer of phosphosilicate glass;

diffusing the phosphorus from the phosphosilicate glass into the trench interior surfaces to form a region of extra doping of the n-conductivity type extending from each of the trenches outward into the well;

removing the phosphosilicate glass from the trenches;

depositing on the interior surfaces of the trenches a layer of borosilicate glass;

diffusing the boron from the borosilicate glass into the trench interior surfaces to form a doped trench face of p-conductivity type extending from each of the trenches outward into the well a distance not as great as the region of extra doping of the n-conductivity type extending from each of the trenches outward into the well;

removing the borosilicate glass from the trenches; and filling the remaining interior space of each trench with a plug of polycrystalline silicon.

15. The process of claim 14 wherein the phosphorus is diffused further in an additional annealing step after the phosphosilicate glass is removed.

16. A process for high capacitance trench capacitors in a semiconductor substrate comprising:

forming in a face of the semiconductor substrate at least one well of n-conductivity type, the well having a bottom;

forming a plurality of trenches within the well, the trenches extending down into the well from the substrate face, each trench having a plurality of interior surfaces, one of which is a bottom surface shallower than the bottom of the well, defining an interior space;

forming a region of extra doping of n-conductivity type extending from each of the trenches outward into the well by the process comprising:

inserting into the trenches a layer of phosphosilicate glass;

diffusing the phosphorus from the phosphosilicate glass into the trench interior surfaces to form a region of extra doping of the n-conductivity type extending from each of the trenches outward into the well; and removing the layer of phosphosilicate glass from the trenches;

forming a doped trench face extending over the interior surfaces of each trench, the trench face being doped with an impurity of p-conductivity type, by the process comprising:

inserting into the trenches a layer of borosilicate glass;

diffusing the boron from the borosilicate glass into the trench interior surfaces to form a doped trench face of the p-conductivity type extending from each of the trenches outward into the well a distance not as great as the region of extra doping of the n-conductivity type extending from each of the trenches outward into the well; and removing the layer of borosilicate glass from the trenches;

coating the interior surfaces of each trench with a thin dielectric layer; and filling the interior space of each trench remaining after thin dielectric formation, with a plug of polycrystalline silicon material.

17. The process of claim 16 wherein the phosphorus is diffused further in an additional annealing step after the phosphosilicate glass is removed.

* * * * *